United States Patent
Lee

(10) Patent No.: US 6,380,818 B1
(45) Date of Patent: Apr. 30, 2002

(54) STRUCTURE FOR REDUCING THE MUTUAL INDUCTANCE BETWEEN TWO ADJACENT TRANSMISSION LINES ON A SUBSTRATE

(75) Inventor: Chun-Ho Daniel Lee, Taipei (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/542,421

(22) Filed: Apr. 4, 2000

(30) Foreign Application Priority Data

Dec. 3, 1999 (TW) ............................ 88121169 A

(51) Int. Cl.[7] .................................................. H01P 5/00
(52) U.S. Cl. ............................... 333/1; 333/12; 333/112
(58) Field of Search .............................. 331/1; 333/12, 333/112

(56) References Cited

U.S. PATENT DOCUMENTS

| | | | | |
|---|---|---|---|---|
| 1,381,089 A | * | 6/1921 | Beverage | |
| 2,018,324 A | * | 10/1935 | Schmidt | |
| 5,042,146 A | * | 8/1991 | Watson | 29/845 |
| 5,294,751 A | * | 3/1994 | Kamada | 174/52.4 |
| 6,249,047 B1 | * | 6/2001 | Corisis | 257/691 |

* cited by examiner

*Primary Examiner*—Robert Pascal
*Assistant Examiner*—Joseph Chang
(74) *Attorney, Agent, or Firm*—J.C. Patents

(57) ABSTRACT

A structure for reducing the mutual inductance between two adjacent transmission lines on a substrate according to the invention includes a loop-shaped transmission line, at least one transmission line located on each side of the loop-shaped transmission line. One end of the loop-shaped transmission line is connected to bond wire and a diagonal end is connected to a signal output on the substrate. The loop-shaped transmission line has a short side equal to ½ of the wavelength of an input signal. With such structure, even though the clock frequency of a used CPU is several hundred MHz, the mutual inductance and cross-talk caused by the mutual inductance can be effectively reduced.

9 Claims, 3 Drawing Sheets

STRUCTURE FOR REDUCING THE MUTUAL INDUCTANCE BETWEEN TWO ADJACENT TRANSMISSION LINES ON A SUBSTRATE

CROSS-REFERENCE TO RELATED APPLICATION

This application claims the priority benefit of Taiwan application serial no. 88121169, filed Dec. 3, 1999.

BACKGROUND OF THE INVENTION

1. Field of the Invention

The invention can be applied to a structure of a printed circuit board or a ball grid array (BGA) board to greatly reduce the mutual inductance among two adjacent transmission lines on a substrate.

2. Description of Related Art

Once PC/XT and later PC/AT personal computers were developed by IBM, many manufacturers have produced IBM PC-compatible personal computers to make this kind of personal computers be worldwide used.

Although, there is a great progress on hardware and software technologies, the layout of the main boards (generally called AT main boards) of the worldwide used personal computers still follow an original way. Furthermore, the areas of main boards are further reduced as BABY AT main boards due to the improvement of hardware, resulting in minimized personal computers. Today, the BABY AT is popularly used and therefore called AT thereinafter. Since personal computers are manufactured on complete production lines, the specification of main boards must meet a standard requirement so as to match with various PC cases or install different interface cards, for example: the specification of the areas of the main boards, the arrangement of interface slots or the positions of countersinks.

Although the specifications of the AT main board are always followed by manufacturers, it is not completely suitable for current personal computers because of the improvement of hardware and software. For example, a mouse has been a standard accessory for a personal computer, but it is necessary to additionally install a RS232 serial port to electrically connect the mouse, resulting in inconvenience. For such reason, another ATX specification which allows some common interfaces to be provided on a main board directly has been developed, wherein main boards with the ATX specification are called ATX main boards.

At present, devices on the main board of a personal computer at least includes a central processing unit (CPU). If the main board has a multi-processing function, it can include more than one CPU. In addition to CPU, the main board has an accelerated graphics part (AGP) connected to a display card, memory slots for the insertion of modular memories and peripheral component interconnects (PCI) for installation of various interface cards. Furthermore, anther control circuit is mostly designed in a chip set which must be connected to the CPU, memories, AGP slots and PCI slots. The arrangement of the pins of the chip set with respect to the positions of other devices must be taken into account. Especially, data processed by the CPU all are 32-bit or more than 32-bit data. Therefore, there are several hundreds of transmission lines among the chip set, CPU, memories, AGP slots and PCI slots. On the other hand, since the clock frequency of the CPU is as high as several hundred MHz, it should be careful during the circuit layout of the main board to ensure the main board stability.

A part of the prior art for a ball grid array (BGA) board or a printed circuit board layout is shown in FIG. 1. A chip set, such as Intel-made chip set 440BX, is mounted on the above conventional ball array board or the printed circuit board. Generally, the chip set has a square flat package with a thickness of several millimeters. Moreover, there are two square planes on both sides of the chip set, wherein one has electrical balls and the other is printed with a text label. In FIG. 1, transmission lines 11, 12, 13 are parallel to one another on a conventional printed circuit board. The mutual inductance of any two adjacent transmission lines has a logarithmic relation with spacing. Therefore, even though the spacing between two adjacent transmission lines is increased, the corresponding mutual inductance can not be effectively reduced. Furthermore, since the clock frequency of a currently used CPU is over several hundred MHz, the mutual inductance of the transmission lines 2 and 3 and transmission lines 2 and 1 becomes more serious. In turn, the mutual inductance then causes a cross-talk effect, resulting in a data error.

FIG. 1A shows a top view of FIG. 1, wherein reference symbols L1, Ls, L2 represent the self-inductance of transmission line 11, 12, 13, respectively, and reference symbol Lm represents the mutual inductance between the transmission line 12 and 13 or the one between transmission lines 12 and 11. Each transmission line has a width of 80$\mu$m and a length of 10000 $\mu$m, and the spacing between any two adjacent transmission lines is 70$\mu$m.

FIG. 1B shows a cross-sectional view of FIG. 1A. In FIG. B, reference symbol h represents a spacing between the transmission lines 11, 12, 13 and a ground plane, wherein the distance h is 100$\mu$m, the thickness d1 of each transmission line is 27 $\mu$m and the thickness d2 of the ground plane is 35 $\mu$m.

Next, Table 1 shows the values of the self-inductance and mutual—inductance of transmission lines of FIG. 1. The self-inductance and mutual inductance are obtained by using Ansoft-Spicelink simulation software under a circumstance of f=100 MHz.

TABLE 1

|  | Ls | Lm | L1 |
|---|---|---|---|
| Prior Art | 0.598 | 0.321 | 0.605 |

Unit: nH/mm

As shown in Table 1, the conventional layout can not reduce the mutual inductance effectively between two adjacent transmission lines.

A simple formula for calculating the mutual inductance between any adjacent transmission lines is given by:

$$Lm/l = (\mu/4Pi)ln(1+(2h/S)^2) \; (\mu H/m)$$

Wherein l: the length of each transmission line $\mu$: permeability

Pi: 3.14159 h: the distance between the transmission lines and ground layer s: the pitch of two adjacent transmission lines As stated in the above formula, the mutual inductance Lm has a logarithmic relation with respect to the space. That is why the mutual inductance Lm can not be effectively reduced just by increasing the spacing.

In summary, the layout of a conventional ball grid array board or printed circuit board has the following disadvantages: the mutual inductance between two adjacent transmission lines can not be effectively reduced. In particular, when the clock frequency of a CPU is as high as several hundred MHz, the mutual inductance between two adjacent transmission lines will become much more serious.

SUMMARY OF THE INVENTION

An object of the invention provides a structure for reducing the mutual inductance between two adjacent transmission lines. With such structure, even though the clock frequency of a used CPU is over hundred MHz, the mutual inductance and cross-talk induced by the mutual inductance can be effectively reduced. Under a circumstance with an equal pitch of transmission lines, the mutual inductance between two adjacent transmission lines can be reduced down to $1/4$–$16$ times than an original mutual inductance. Moreover, for a two-layer ball grid array board without the ground plane, the effect will become more obvious.

A structure for reducing the mutual inductance between two adjacent transmission lines on a substrate according to the invention can be applied on the layout of a main board. The structure includes a loop-shaped transmission line, at least one transmission line located on each side of the loop-shaped transmission line, wherein one end of the loop-shaped transmission line is linked to mother board and a diagonal end is connected to an signal input on the substrate. The loop-shaped transmission line has a short side with a length equal to ½ of the wavelength of an input signal.

BRIEF DESCRIPTION OF THE DRAWINGS

The invention will be understood easier from the detailed description given hereinafter and the accompanying drawings which are given by way of illustration only, and thus do not limit the present invention, and wherein.

DETAILED DESCRIPTION OF THE PREFERRED EMBODIMENTS

Figure 1:
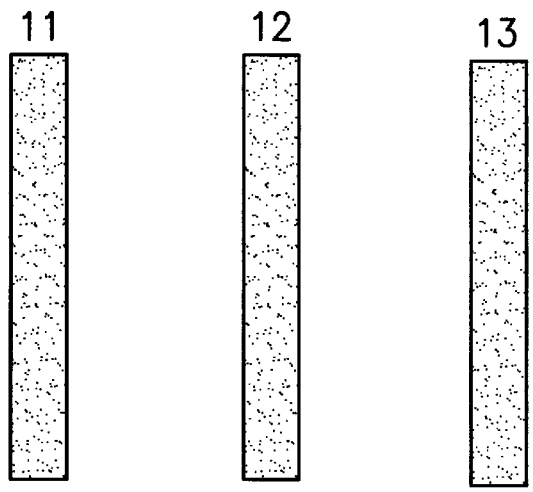
FIG. 1 is a schematic view showing a part of the layout of a ball grid array (BGA) board or a printed circuit board according to the prior art.
Figure 1A:
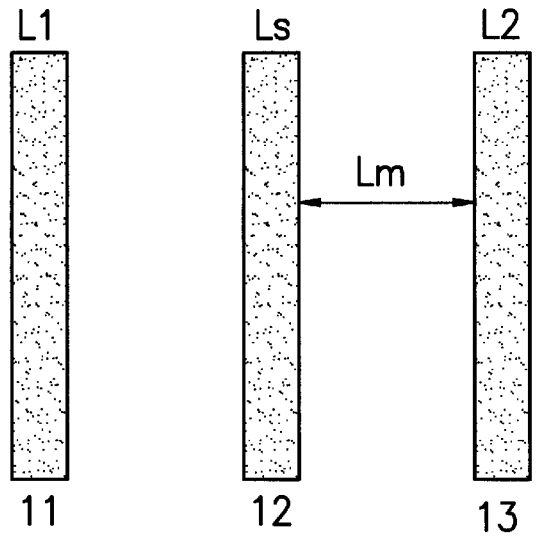
FIG. 1A is a top view of FIG. 1.
Figure 1B:
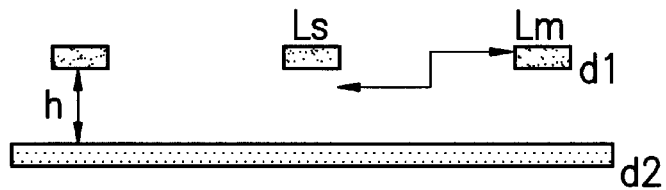
FIG. 1B is a cross-section view of FIG. 1A.
Figure 2:
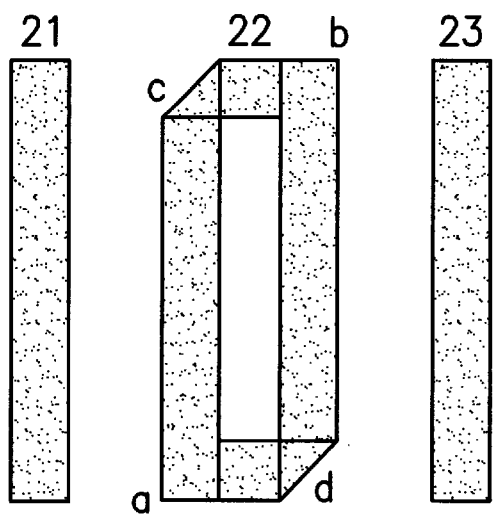
FIG. 2 is a schematic view showing a structure for reducing the mutual inductance between two adjacent transmission lines according to a first embodiment of the invention.

A structure for reducing the mutual inductance between two adjacent transmission lines according to a first embodiment is shown in FIG. 2. Transmission lines 21, 23 are the same as the transmission lines 11, 13 of FIG. 1. To replace the transmission line 12 of FIG. 1, a loop-shaped transmission line 22 is used in the first embodiment. One corner a of the loop-shaped transmission line 22 serving as a signal input point is linked to bond wire. Another corner b of the loop-shaped transmission line 22 serving as a signal output point is linked to the printed circuit board or BGA Ball. In order to prevent an antenna effect resulting from a high-frequency clock, corners c and d of the loop-shaped transmission line 22 are mitered. Furthermore, the length of the short sides ad, bc of the loop-shaped transmission line 22 is set as ½ of the wavelength of a transmitted signal. Such structure can be used for an application with a high-frequency clock. This structure of the first embodiment can make signals on the long sides ac, bd out of phase. Therefore, the mutual inductance generated by a current flowing through the long side ac is counteracted by that of the long side bd. As a result, a cross-talk effect can be effectively eliminated.

Figure 2A:
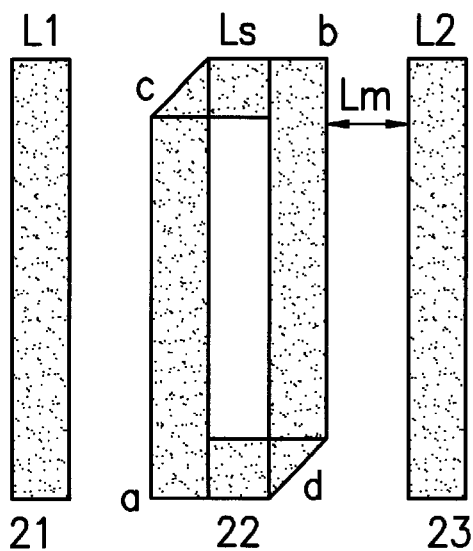
FIG. 2A is a top view of FIG. 2.

Referring to FIG. 2A, a top view of FIG. 2 is shown. Reference symbol L1 represents the self-inductance of the transmission line 21; reference symbol L2 represents the self-inductance of the transmission line 23; reference symbol Ls represents the self-inductance of the loop-shaped transmission line 22; and reference symbol Lm represents the mutual inductance between the loop-shaped transmission line 22 and the transmission line 23 or between the loop-shaped transmission line 22 and the transmission line 21. Moreover, each transmission line has a width of 80 $\mu$m and a length of 1000 $\mu$m. The pitch of the transmission lines 21, 22, 23 is 150 $\mu$m.

Figure 2B:
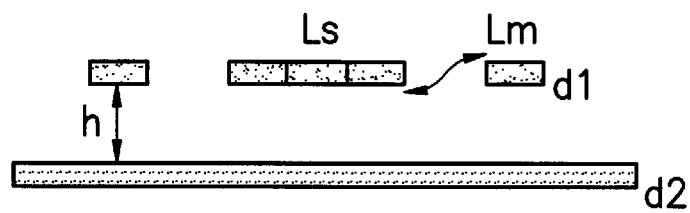
FIG. 2B is a cross-sectional view of FIG. 2.

Referring to FIG. 2B, a cross-sectional view of FIG. 2 is shown. Reference symbol h represents the distance between the transmission lines and a ground plane, wherein h is 100 $\mu$m. The thickness d1 of each transmission line is 27 $\mu$m, and the thickness d2 of the ground plane of the printed circuit board is 35 $\mu$m.

Next, Table 2 shows the values of the self-inductance and mutual inductance of the transmission lines of FIGS. 1 and 2. It shows the comparison of the inductance and mutual inductance between the prior art and the present invention. From Table 2, even though the spacing of each transmission line of the conventional parallel layout is increased from 70 $\mu$m to 145 $\mu$m, the mutual inductance between two adjacent transmission line is only reduced from 0.321 nH/mm to 0.279 nH/mm. The mutual inductance of the present invention is about 0.076 nH/mm, which is 0.272 times smaller than that of the prior art at a space of 145 $\mu$m. Therefore, with the structure of the present invention, the mutual inductance at a space of 145 $\mu$m can be effectively reduced −11.3dB.

TABLE 2

|  | Ls | Lm | L1 = L2 |
|---|---|---|---|
| Prior Art (space = 70 $\mu$m) | 0.598 | 0.321 | 0.605 |
| Prior Art (space = 145 $\mu$m) | 0.621 | 0.279 | 0.633 |
| Present Invention (space = 70 $\mu$m) | 0.545 | 0.076 | 0.559 |

Unit:nH/mm

Additionally, Table 3 also shows the self-inductance and mutual inductance of the transmission lines of FIGS. 1 and 2, but without a grounded layer provided, as follows:

TABLE 3

|  | Ls | Lm | L1 = L2 |
|---|---|---|---|
| Prior Art (space = 70 $\mu$m) | 1.08 | 0.786 | 1.09 |
| Prior Art (space = 145 $\mu$m) | 1.1 | 0.715 | 1.11 |
| Present Invention (space = 70 $\mu$m) | 0.597 | 0.125 | 1.1 |

Unit:nH/mm

From Table 3, even though the spacing of each transmission line is increased from 70 $\mu$m to 145 $\mu$m, the mutual inductance between two adjacent transmission line is only reduced from 0.786 nH/mm to 0.715 nH/mm. The mutual inductance of the present invention is about 0.125 nH/mm which is 0.175 times smaller than that of the prior art at a space of 145 μm. Therefore, with the structure of the second embodiment, the mutual inductance at a space of 145 μm can be effectively reduced −15.1dB.

Figure 3:
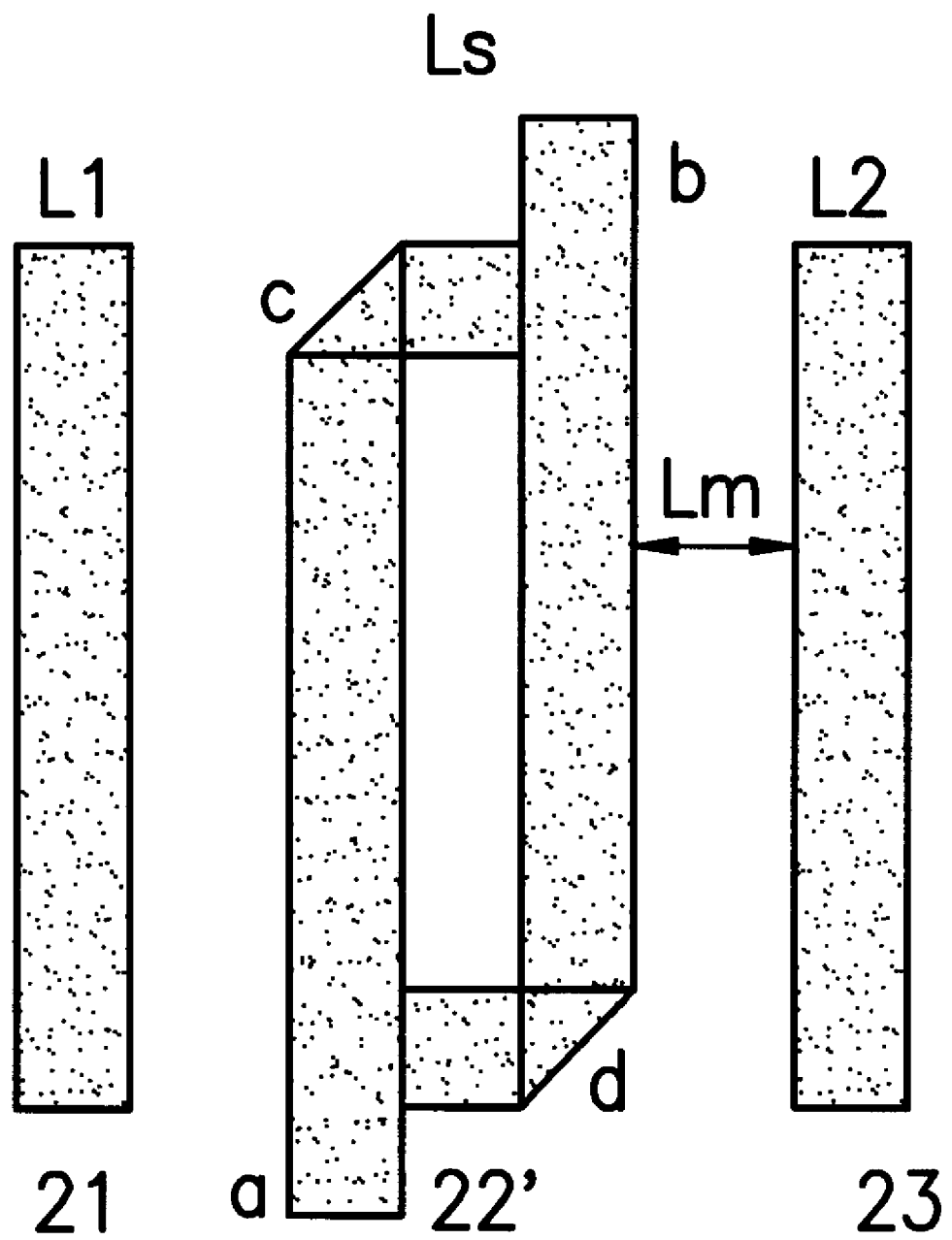
FIG. 3 is a schematic view showing a structure for reducing the mutual inductance between two adjacent transmission lines according to a second embodiment of the invention.

Furthermore, referring to FIG. 3, a schematic view of a structure for reducing the mutual inductance between two adjacent transmission lines according to a second embodiment is shown. The structure of the second embodiment is almost the same as that of the first embodiment except that long sides ac, bd protrude beyond the short side ad, bc, wherein one corner a serving as a signal input point is linked to a printed circuit board or bond wire while another corner b serving as a signal output point is linked to the printed board or BGA ball.

In summary, compared to the prior art, the structure for reducing the mutual inductance between two adjacent transmission lines according to the present invention has the following advantages:

The mutual inductance between two adjacent transmission lines and cross-talk caused by the mutual inductance can be effectively reduced using a loop-shaped transmission line even when a high-frequency clock on a main board is more than several hundred MHz.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A structure for reducing the mutual inductance between two adjacent transmission lines comprises:
    a loop-shaped transmission line;
    at least one transmission line located on each side of the loop-shaped transmission line, one end of the loop-shaped transmission line connected to bond wire and a diagonal end of the loop-shaped transmission line electrically connected to a signal output on the substrate, wherein the loop-shaped transmission lines has a short side with a length equal to ½ of the wavelength of an input signal.

2. The structure as claimed in claim 1, wherein the substrate is a printed circuit board.

3. The structure as claimed in claim 1, wherein the substrate is a ball grid array board.

4. The structure as claimed in claim 1, wherein the loop-shaped transmission line has a rectangular shape.

5. The structure as claimed in claim 1, wherein the loop-shaped transmission line has a rectangular shape with the connecting ends protruding outside the rectangular shape.

6. The structure as claimed in claim 1, wherein two diagonal corners of the loop-shaped transmission line are mitered for reducing an antenna effect.

7. The structure as claimed in claim 1, wherein the signal is a high-frequency clock.

8. The structure as claimed in claim 7, wherein the signal has a frequency greater than 1 GHz.

9. The structure as claimed in claim 1, wherein the substrate has a ground plane.

* * * * *